(12) United States Patent
Godil et al.

(10) Patent No.: US 10,437,046 B1
(45) Date of Patent: Oct. 8, 2019

(54) MICRO ELECTRO MECHANICAL SYSTEM AND LAYERED HINGE FOR USE IN MEMS MICROMIRROR HAVING FIRST AND SECOND SERPENTINE SHAPES

(71) Applicant: AG Microsystems Inc., Fremont, CA (US)

(72) Inventors: Asif Godil, Pleasanton, CA (US); Chase Valiente, San Jose, CA (US)

(73) Assignee: AG MICROSYSTEMS, INC., Fremont, CA (US)

( * ) Notice: Subject to any disclaimer, the term of this patent is extended or adjusted under 35 U.S.C. 154(b) by 550 days.

(21) Appl. No.: 15/145,803

(22) Filed: May 4, 2016

Related U.S. Application Data

(63) Continuation of application No. 14/925,792, filed on Oct. 28, 2015, now abandoned.

(60) Provisional application No. 62/122,715, filed on Oct. 28, 2014.

(51) Int. Cl.
| | |
|---|---|
| *G02B 26/08* | (2006.01) |
| *G02B 26/10* | (2006.01) |
| *G02B 7/00* | (2006.01) |
| *G02B 7/02* | (2006.01) |

(Continued)

(52) U.S. Cl.
CPC ..... *G02B 26/0841* (2013.01); *G02B 26/0833* (2013.01); *B81B 7/0003* (2013.01); *B81B 7/02* (2013.01); *B81B 2201/04* (2013.01); *B81B 2203/0145* (2013.01); *B81B 2207/091* (2013.01); *G02B 26/101* (2013.01); *G02B 26/105* (2013.01)

(58) Field of Classification Search
CPC .... G02B 26/0833–0866; G02B 26/101; G02B 26/105; G03B 21/14; G03B 21/142; G03B 21/20; G03B 21/2033; G03B 21/28; B81B 3/0062; B81B 7/0003; B81B 7/008; B81B 7/02; B81B 2201/033; B81B 2201/04–047; B81B 2203/0136–0172; B81B 2203/058; B81B 2207/091
USPC ..... 250/230, 234; 347/255–260; 353/39, 98, 353/99; 359/198.1–200.3, 200.6–200.8, 359/202.1, 212.1–215.1, 221.2–221.4, 359/223.1–226.2, 298, 321, 871, 872, 359/876, 877; 385/15–18; 398/12, 19, 398/45

See application file for complete search history.

(56) References Cited

U.S. PATENT DOCUMENTS

| | | |
|---|---|---|
| 6,717,325 B2 | 4/2004 | Fernandez et al. |
| 6,914,710 B1 | 7/2005 | Novotony et al. |
| 7,833,430 B2 | 11/2010 | Mi et al. |

(Continued)

*Primary Examiner* — Jennifer D. Carruth
*Assistant Examiner* — Ryan S Dunning
(74) *Attorney, Agent, or Firm* — Morgan, Lewis & Bockius LLP

(57) ABSTRACT

Two-axis MEMS Micromirror is disclosed featuring combs drive actuation with independent drive for each of two axes of rotation and a layered hinge design providing an improved shock and vibration performance. The two-axis MEMS Micromirror is fabricated using Double SOI wafer as the primary starting material. In addition, actuation voltages are driven to an inner axis through multiple layers in one or more outer hinges, allowing for a robust and reliable micromirror that is easy to drive with multiple DC voltages, and moderately insensitive to temperature, shock and vibration. Furthermore, this novel design achieves set angles that are highly stable over time.

15 Claims, 5 Drawing Sheets

(51) Int. Cl.
   *B81B 7/00* (2006.01)
   *B81B 7/02* (2006.01)

(56) References Cited

U.S. PATENT DOCUMENTS

| | | |
|---|---|---|
| 7,872,394 B1 | 1/2011 | Gritters et al. |
| 10,268,037 B2 * | 4/2019 | Yasumura ............. B81B 3/0045 |
| 2004/0100679 A1 * | 5/2004 | Kuo ................... G02B 26/0841 |
| | | 359/291 |

* cited by examiner

MICRO ELECTRO MECHANICAL SYSTEM AND LAYERED HINGE FOR USE IN MEMS MICROMIRROR HAVING FIRST AND SECOND SERPENTINE SHAPES

This application is a continuation of U.S. patent application Ser. No. 14/925,792, filed Oct. 28, 2015, which claims the benefit of U.S. Prov. Pat. Appl. No. 62/122,715 filed on Oct. 28, 2014, entitled "TWO-AXIS MEMS MICROMIRROR." Each of the above applications is hereby incorporated herein by reference in its entirety.

TECHNICAL FIELD

The subject of this application generally relates to the field of MEMS (Micro Electro Mechanical Systems) actuators. In particular, to two-axis MEMS Micromirrors.

BACKGROUND

MEMS based actuators are enabling the emergence of a host of new fiber-optic components that are more compact and reliable than their predecessors. They can also operate at lower power and are more cost effective. Examples of such components include switches, variable optical attenuators (VOA), tunable filters, optical channel monitors, wavelength selective switches, and wavelength blockers.

One particular class of MEMS devices for such applications is a two-axis MEMS Micromirror. In the simplest case, it is a two-axis gimbaled mirror driven by four quadrant electrodes, in parallel plate configuration, under the mirror. An improvement was made on this by Fernandez (U.S. Pat. No. 6,717,325) by using three independent electrodes (reducing the number of electrodes from 4 to 3). Further improvements were made through the use of comb drive actuation instead of parallel plate, such as Novotony (U.S. Pat. No. 6,914,710), Xiaoyu (U.S. Pat. No. 7,833,430), and Gritters (U.S. Pat. No. 7,872,394).

Notwithstanding these advantages, there remain some important limitations in the approaches of Novotony, Xiaoyu, Gritters and others. The two-axis MEMS Micromirror allows the body of the mirror portion to rotate in three dimensions using a design having an inner axis of rotation that is orthogonal to an outer axis of rotation. Some of the limitations of the two-axis MEMS Micromirror include poor performance under shock and vibration. Specifically, in dual-axis mirrors the reliability of the mirror's rotation and performance are affected by shock and vibration.

A novel design is presented here and offers improvement in the fabrication process of a dual-axis MEMS Micromirror, as well as distinct advantages in the actuation performance, reliability, and functional capabilities of the device. The novel design and performance enhancements of such devices are especially vital for applications demanding lower voltage and higher stability. There exist a need for a reliable MEMS Micromirror and ease of fabrication of such devices. The design and fabrication method proposed in this disclosure achieve these needs based on the use of a Double SOI wafer, which leads to a simplified fabrication process.

DETAILED DESCRIPTION

In accordance with one embodiment, the present application discloses a two-axis MEMS Micromirror with comb drive actuation, and independent actuation for the two axes.

Figure 1:
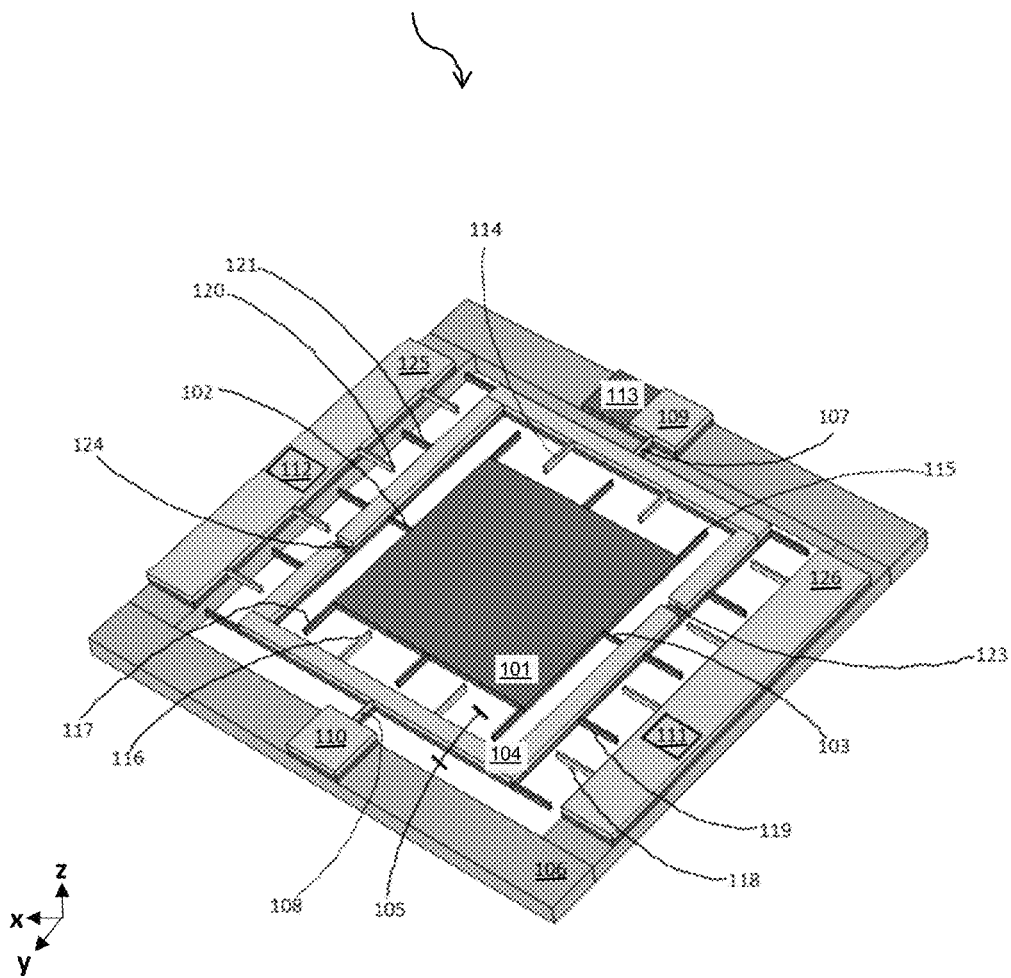
FIG. 1 shows an example isometric view of the two-axis MEMS Micromirror device showing comb drive actuation.

In accordance with one embodiment, a two-axis MEMS Micromirror 100 is shown in FIG. 1. A micromirror (101)—sometimes referred to simply as "mirror"—with comb rotor fingers (115, 117) is suspended above a cavity (105) with a torsional hinge (102, 103) on each side. The pair of torsional hinges (102, 103) that are coupled directly to the mirror (101) are called inner hinges and define a first axis of rotation for the mirror (101). This first axis of rotation is designated as x-axis. The opposite ends of the inner hinges mechanically and electrically connect to a thin frame (104) that completely surrounds the mirror (101). This frame (104), called the inner frame, functions as a rotating frame with respect to the stationary surrounding platform (106) using a second pair of torsional hinges (107, 108).

The inner frame (104) is coupled to the stationary surrounding platform (106) by means of the second pair of torsional hinges (107, 108), which effectively forms a second axis of rotation for the mirror's (101), this second axis is orthogonal to the first axis and is designated as the y-axis of. The second pair of hinges (107, 108) are referred to as outer hinges and includes electrical pathways that are electrically connected at their far ends to a set of drive bondpads (109, 110), where electrical voltage and/or current is transmitted through the electrical pathways to electrically separated portions of the inner frame (104) as depicted by a pair of isolation cuts (123, 124).

The mirror (101) is actuated (or is forced to rotate in a first direction or a second direction around the x-axis) by supplying, or the application of, a voltage to any one of these drive bondpads (109, 110). In addition to these two drive bondpads (109, 110), which power the rotation about the inner x-axis, another pair of drive bondpads (111, 112) are used to actuate (or to force a rotation in a third direction or a fourth direction around the y-axis) by supplying a voltage to any one of these drive bondpads (111, 112). As can be understood and seen in FIG. 1, the x-axis of rotation defined by the torsional hinges (102, 103) is orthogonal to the y-axis of rotation defined by the torsional hinges (107, 108).

In accordance with one embodiment, the present application discloses a two-axis MEMS Micromirror device that is fabricated out of a stack of layers: (i) a Top Device Layer (TDL), which includes top portions of the frame (104), the torsional hinges (102, 103), and the drive bondpads (109, 110, 111, and 112) all of which are shaded lightly; (ii) a Bottom Device Layer (BDL) which includes the mirror (101), the torsional hinge (102, 103), and bottom portions of the frame (104), the torsional hinges (107, 108), and the drive bondpads (109, 110, 111, and 112) all of which are shaded dark); and (iii) a stationary platform (106) showing the boundaries of the etched cavity in the substrate wafer and is shaded medium gray. The entire device shown in FIG. 1 sits on a silicon substrate (not shown). There is a thin layer of oxide between each of the layers to provide electrical isolation.

In accordance with one embodiment, the mirror (101) having a rectangular shape and is constituted in the Bottom Device Layer (BDL), as shown in FIG. 1, along with the associated rotor combs (115, 117). These combs are interdigitated with a corresponding set of stator combs (114, 116) which protrude from the inner frame (104) and are formed in the Top Device Layer (TDL). The inner frame (104) has a top portion that is constituted in the TDL and a bottom portion that is constituted in the BDL. Moreover, pair of small isolation cuts (123, 124) are formed in the top portion of the inner frame (104) at two opposing sides of the frame. These isolation cuts serves to electrically isolate electrical pathways in the top portion of the inner frame (104) and thus forming two electrically isolated parts of the top portion of the inner frame (104) to receive the two supply voltages from drive bondpads (109, 110), thereby allowing for controlled directional rotation about the x-axis on either side corresponding to voltage supplied at either drive bondpads (109, 110). Thus, directional rotation in the clockwise or counterclockwise directions is achieved through the controlled application of voltages to either drive bondpad (109) or drive bondpad (110) located at opposite ends of the device straddling (perpendicular to) the x axis formed by the torsional hinges (102, 103), as shown in FIG. 1.

In accordance with one embodiment, the bondpads (109) is referred to as the $X^-$ terminal and is coupled to the outer hinge (107) which is located near the top of FIG. 1. On the opposite side of the device, the outer hinge (108) connects to another drive bondpad (110), which is referred to as the $X^+$ terminal, and serves as one of the two drive terminals for the inner x axis. The bondpads are typically defined by small areas (for example, approximately 150 um$^2$) of metal deposited onto the TDL layer. The metal may be Aluminum or Gold with some barrier layers to avoid metal diffusion into the underlying silicon. The pads are typically alloyed in an oven to initiate ohmic contact with the underlying silicon.

In accordance with one embodiment, the voltage applied at drive bondpads (109) and (110) is carried through the TDL portion of the outer hinges (107, 108) and onto the top portion of the inner frame (104), up until the point of the isolation cut. Thus, the isolation cuts define two separate conductive regions or electrodes. One of these electrodes supplies the voltage received from drive bondpads (109) to stator combs (114) to provide drive actuation, while the other electrode supplies the voltage received from drive bondpads (110) to stator combs (116) to provide drive actuation. Note the presence of a non-conductive layer, e.g. a thin oxide no shown in FIG. 1, that electrically isolates the two layers TDL and BDL from each other.

Drive voltages are supplied to drive bondpads (109, 110, 111, and 112) made to propagate through the device by means of electrical conduction through the top portions of drive bondpads (109, 110, 111, and 112), torsional hinge (107, 108, and inner frame (104). Moreover, a mirror supply voltage is supplied via bondpad (113) which is electrically coupled to the BDL. This mirror supply voltage, e.g. a ground potential, propagates through the bottom portions of drive bondpads (109, 110), torsional hinge (107, 108), inner frame (104), torsional hinges (102, 103), and micromirror (101). In this case, the ground potential propagates from bondpad (113) to mirror (101) through the BDL portions of the outer hinges (107, 108), the inner frame (104), and then through the inner hinges (102, 103) to ground the entire rectangular mirror (101) and all rotor comb fingers formed in the bottom layer of the mirror (101) or the inner frame (104). In this manner, a voltage supplied to the single bondpad (113) reaches the micromirror (101) and all rotor combs (115, 117, 119, and 121), using the BDL portions of the inner frame (104) and the hinges (102, 103, 107, and 108). The bondpad (113) may be referred to as ground bondpad, and is shown near the top of FIG. 1 next to drive bondpad (109) which is electrically isolated from bondpad (113) using, for example, a nonconductive layer.

Turning attention now to the function of the outer axis, rotation of the inner frame (104) about they axis is powered through a set of comb banks (118, 119, 120, and 121). These comb banks, called outer combs, are positioned at the outer edge of the inner frame along two of its opposing sides, and are also comprised of a set of interdigitated comb fingers. The outer rotor combs (119, 121) are constituted in BDL and protrude from the inner frame, while the outer stator combs (118, 120) are constituted in TDL and protrude from long electrodes (125, 126) located on the stationary outer platform (106). The pair of long electrodes can be driven independently, each by its own bondpad. These bondpads (111, 112), labeled as the $Y^-$ and $Y^+$ terminals, supply power to provide rotation about the y-axis.

In accordance with one embodiment, a cavity (105) etched out of the substrate wafer provides the necessary space below the rotating members of the device to allow for a substantial range of angular rotation. The stationary surrounding platform (106) constitutes a piece of the substrate wafer remaining after the etching of the cavity. The fabrication details related to cavity etch, as well as the entire fabrication process for this device, are described in the paragraphs below.

In accordance with one embodiment, the fabrication process is depicted in the cross-sectional views of FIGS. 2a-2h. We start with a Double SOI wafer (200) shown in FIG. 2a with the silicon handle (201), first buried oxide (202) and first SOI layer (203), which later becomes the TDL layer. The buried oxide is typically 0.1-1.0 um thick and the SOI layer is typically 10-50 um. A second buried oxide (204) of similar thickness is found underneath the top SOI layer (205), which later becomes the BDL layer. Both layers of oxide have similar thicknesses; likewise, both SOI layers also have similar thicknesses. The handle wafer (201) typically has thickness in the range of 300-600 um.

Figure 2:
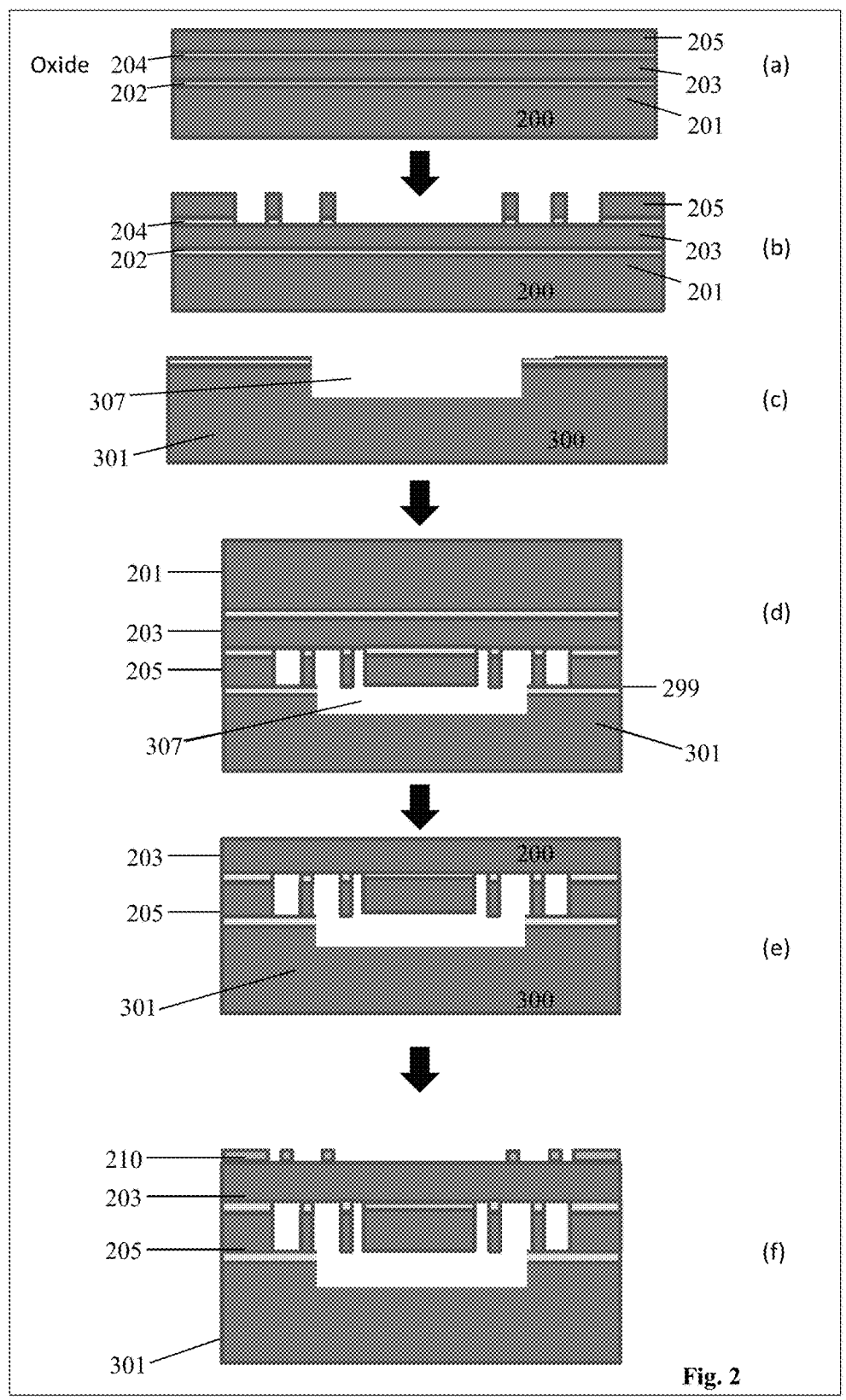
FIGS. 2(a) through 2(h) are exemplary cross-sectional views illustrating process steps for the fabrication of the two-axis MEMS Micromirror.
Figure 2:
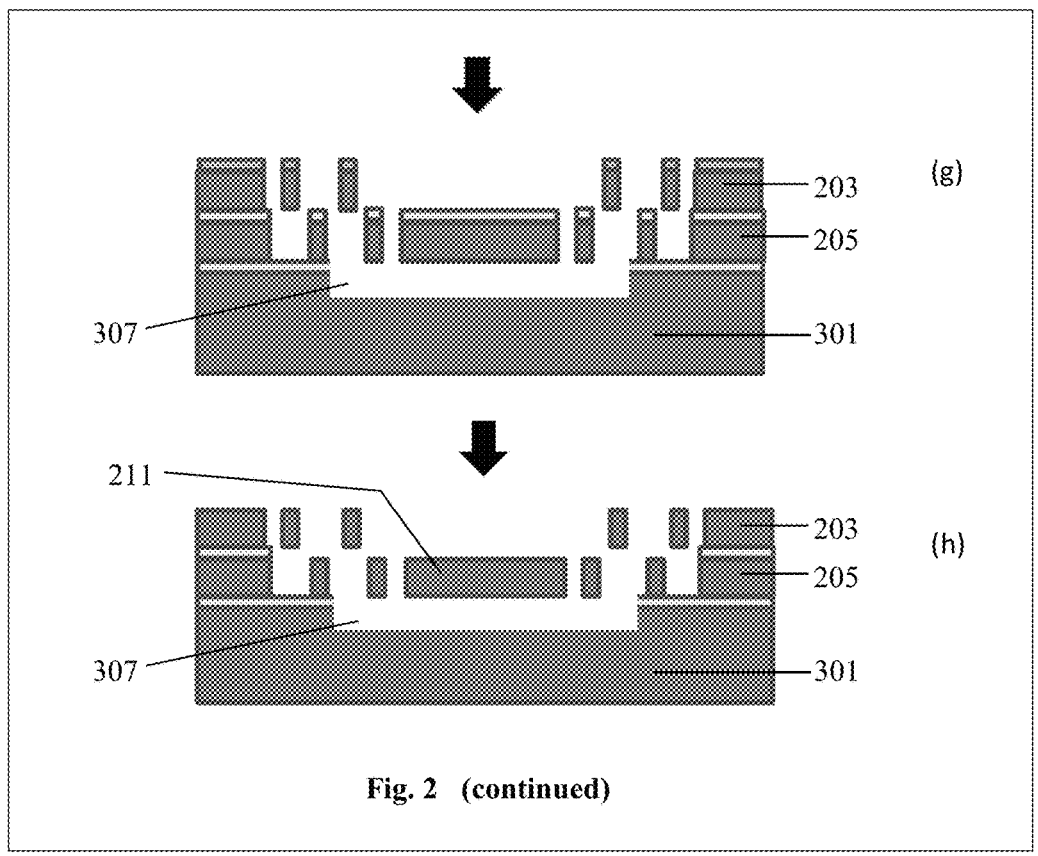

In process steps leading up to FIG. 2b, features in the BDL layer (205) are defined with a contact or stepper mask. The features are defined by spinning photoresist over the wafer and completing standard photolithography techniques. After the features have been defined in photoresist, the top SOI layer (205) is etched down to the second buried oxide (204) by a deep reactive ion etcher (DRIE) such as the STS silicon etcher.

In parallel, some processing steps are carried out on a secondary wafer (300), which is a Double Sided Polished (DSP) silicon wafer and ultimately forms the substrate of the final device. The device cavity (105) shown in FIG. 1 is patterned on this wafer using standard photolithography techniques. The shape of the cavity is chosen to cover all the moving parts of the device such as mirror, frame, inner and outer combs. The cavity (307; also 105) is etched down typically 30-150 um by a deep reactive ion etcher (DRIE) such as the STS silicon etcher. The finished wafer is shown in FIG. 2c.

FIG. 2d shows that the primary starting wafer (200) has been turned upside down and bonded to the secondary wafer (300). This aligned bonding is performed between the etched surface of the Double SOI wafer (200) and the etched surface of the DSP wafer (300). A carefully designed alignment scheme, including the use of backside alignment marks on wafer 300, is employed to achieve precise alignment between Cavity and BDL features within +/−20 um accuracy. Fusion bonding throughout the bonding surface (299) is carefully monitored to ensure good bond quality.

In process step 2e, the bulk silicon of the handle wafer (201) is removed. This may be carried out through a very careful and delicate grind and polish, followed by chemical removal of the remaining handle. After the handle is removed, the first buried oxide is also removed using a wet oxide etch. Care is taken to minimize the risk of liquid being trapped inside the numerous cavity features located across the entire surface of the bonded wafer.

In process step 2f, TDL features are defined in the photoresist layer (210) using the TDL mask and standard photolithography techniques. The alignment requirement on lithography for this step is very stringent because the relative alignment between rotor and stator combs is critical for proper function of the device. Tight alignment tolerance in this step can be achieved by careful use of an IR microscope to visually match alignment marks at depths varying by 20-50 um, or by opening up windows in the first SOI layer (203) to alignment marks at the surface of the second SOI layer (205). The TDL alignment marks are thus aligned to BDL marks. After lithography, the TDL features including stator combs are etched by the STS silicon etcher. The completion of this step occurs in FIG. 2g, which shows that top silicon has been etched away in the STS etcher to define the TDL features.

FIG. 2g offers a clear depiction of the emerging device, including the key features in both TDL (203) and BDL (205). The critical alignment with the cavity features (307) is also visibly displayed.

The process culminates with the removal of exposed oxides using wet HF or a dry oxide etcher, illustrated in FIG. 2h. The removal of oxides exposes the surface of the rotating mirror (211), where the mirror metal will be deposited subsequently.

In accordance with one embodiment, bondpad metal is deposited through a shadow mask and is nominally comprised of Aluminum or Gold with some adhesion layers and some diffusion barrier layers as well. There are four drive bondpads and typically two ground pads per chip. The ground pad grounds the BDL layer as well as the substrate layer (301). The bondpad metal is alloyed at an elevated temperature (350-400C) to activate the ohmic contact. This is followed by depositing the mirror metal through another shadow mask onto the rectangular silicon mirror. For IR (infrared) application in the Telecom wavelength, the mirror metal is usually a thin layer of Gold with an adhesion layer of Titanium, or Aluminum in some cases. Hence, a deposition of a reflective metal onto the rectangular mirror completes the fabrication of the wafer, ideally yielding functional devices capable of angular rotation. Various methods are available to dice the wafer into individual chips.

Figure 3:
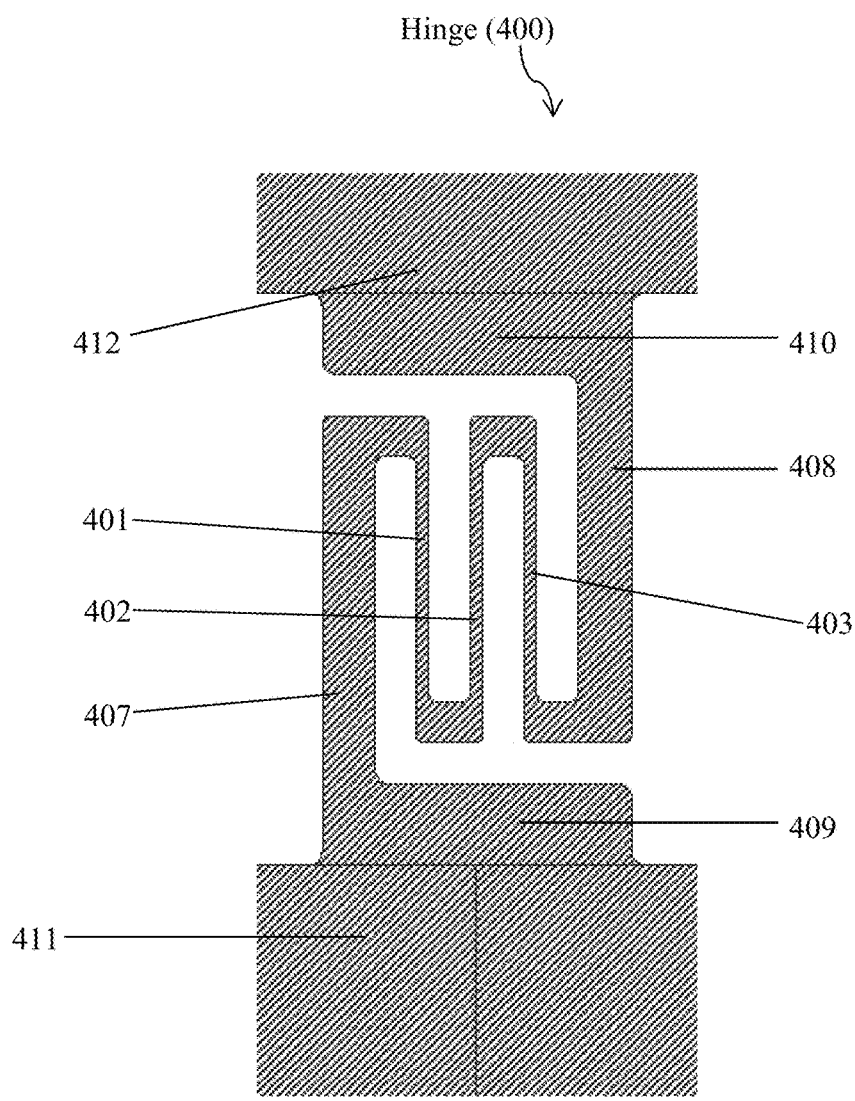
FIG. 3 shows an example three elements hinge.

While particular embodiments of the present invention and their advantages have been shown and described, it should be understood that various changes, substitutions and alterations can be made therein without departing from the spirit and scope of the invention. For example, the mirror shown in FIG. 1 exhibits a rectangular shape. Yet, another mirror, circular or elliptical in shape, may be substituted to provide an alternative embodiment of the invention. In this case the inner frame around the mirror maybe designed to partly follow the contour of the mirror. Likewise, the mirror shown in FIG. 1 is constituted in the Bottom Device Layer (BDL). Yet, another embodiment of the invention may well exhibit the mirror in the Top Device Layer (TDL) instead. In this case the rotor combs will also be in the TDL layer and the stator combs will be in the BDL layer. Accordingly, the TDL layer would be grounded and drive voltages conducted through the BDL layer. Or potentially, in some design embodiments, the hinges may be serpentine, or take on some other complex shape, in place of the simple, straight hinges shown in FIG. 1. An example of a 3-element serpentine hinge (400) is presented in FIG. 3.

In accordance with one embodiment, serpentine hinges may be used to increase stiffness in the transverse direction to help improve the transverse snap margin of the device. Serpentine hinges employ a number of thin elements acting in parallel to optimize the stiffness parameters of the hinge. The design of serpentine hinges in any given application usually involves a trade-off between torsional stiffness and transverse stiffness. The number of hinge elements can be as small as two, while in other cases it may theoretically be as high as 15 or more. The 3-element serpentine hinge (400) shown in FIG. 3 offers a useful combination of transverse stiffness with torsional flexibility, while still providing sufficient strength in the out-of-plane direction. Note that the thin hinge elements (401, 402, 403) are supported by thick braces (407, 408) at the two ends of the hinge. The thick braces (407, 408) lie in parallel to the thin elements (401, 402, 403), and their thickness is sufficient to preclude the possibility of torsional rotation. Thus, the thick braces (407, 408) function as infinitely stiff support members to the rotating thin elements (401, 402, 403). At each of their vertical ends, the thick braces (407, 408) connect to thick nubs (409, 410), which serve to effectively surround the hinge, providing support on all four of its sides. One of these nubs (410) is coupled to the stationary platform or the anchor (412) side of the hinge (400), while the other nub (409) is coupled to the rotating side of the hinge (400) which is typically the mirror (101) or the mirror frame (frame 104).

The performance and proper rotation of the mirror (101) are important to the reliability and correct operation of the two-axis MEMS Micromirror. As described above, the design and manufacturing process of each element of the two-axis MEMS Micromirror plays a role in determining the overall cost and reliability of the two-axis MEMS Micromirror. Shock and vibration play a big role in the correct operation of micro mirrors devices. Thus, evaluating and specifying the operation of the two-axis MEMS Micromirror under certain amount of shock or vibration can lead to angle variations or in some cases to unexpected failures. Employing the hinge (400) design in the two-axis MEMS Micromirror (100) device can help with certain improvement.

As described above, the two-axis MEMS Micromirror (100) is manufactured or fabricated using Fusion bonding of (i) a TDL and BDL that are processed out of a single Double SOI wafer (200), and (ii) a bottom wafer that is processed out of a Double Sided Polished (DSP) silicon wafer. In addition, as in the example two-axis MEMS Micromirror described above, the mirror (101) itself can be manufactured in either the TDL or the BDL layers. The two-axis MEMS Micromirror (100), as shown in FIG. 1, discusses the mirror (101), the rotor combs (115, 117) protruding from the mirror (101), and the outer rotor combs (119, 121) protruding from the inner frame are all constituted in the BDL, while the outer stator combs (118, 120) are constituted in TDL and protrude from long electrodes (125, 126) mechanically attached to the stationary outer platform (106). However, performance of the two-axis MEMS Micromirror under shock and vibration suffers and can be improved by implementing a unique and novel design of a hinge (500) as will be described below.

In order to describe the poor performance of the two-axis MEMS Micromirror, the effect of shock and vibration on the mirror (101) is analyzed along both axis of rotations, namely the x-axis and the y-axis. Now consider an in-situ shock in the x, y and z direction and analyze how the mirror rotational angle may be disturbed in the x-axis and/or in the y-axis. It is understood that this analysis is applied as an example for the example two-axis MEMS Micromirror as shown in FIG. 1. Similar analysis would be used for other types or designs. First, looking at the x-axis (or inner axis) and then the y-axis (or the outer axis). In the example design of FIG. 1, the axis of rotation, as defined by the torsional hinges (102, 103), is located mid-way of the mirror (101) by designing the hinges (102, 103) location at half way into the BDL layer and thus the center of mass (CM) of the mirror (101) would be balanced along the x-direction, z-direction and y-direction along the x-axis rotation.

First in the z-direction the mirror is balanced and so the Center of Mass (CM) of the mirror will pass thru the x-axis, and so a shock in the z-direction will produce a body load which will pass through the x-axis and thus will not produce any torque around the x-axis, and thus, the mirror angle will not change. Similarly a shock in the y-direction or x-direction will also produce a body load which will pass thru the axis of rotation (halfway into the BDL layer) and thus not produce any torque that can change the angle. Of course in practice minor deviations and perturbations may occur and thus the mirror (101) may not be well balanced due to imperfections.

Second, we consider the effect of shock and vibration of the body load of the mirror (101) around the y-axis of rotation. Similarly, as described above with respect to the x-axis, the body load of the mirror (101) and the inner frame (104) are balanced about the y-axis in the z-direction and the y-direction but not in the x-direction. Thus, a shock in the z-direction and y-direction would not produce a torque that affects the angle of rotation along the y-axis. One can notice that along the x-direction, it can be seen from FIG. 1 that, there is more body load in the BDL layer than the TDL layer and so the net CM (center of mass) is in the BDL layer below the axis of rotation and will create a torque around the outer y-axis of rotation, hence, a change the outer angle of rotation during in-situ shock and vibration along.

In accordance with one embodiment, the outer hinges (107, 108) are designed to have a first portion in the TDL layer and a second portion in the BDL layer, the first portion having a first torsional stiffness and the second portion having a second torsional stiffness that is different from the first torsional stiffness (e.g. smaller or larger than the first one). The first portion may have a different shape, size, area, thickness, density, dimension or mass than the second portion. For example, if the shape of the first portion results in a first torsional stiffness that is different from a second torsional stiffness resulting from the shape of the second portion, then the combined effect of the first torsional stiffness and the second torsional stiffness causes an effective translation or a shift of the hinge's axis of rotation in one or more direction with respect to a given coordinate systems.

In accordance with one embodiment, the combined effect of the differences in the shape and mass of the first and second portions of the hinge causes an effective translation of the axis of rotation in two or more directions with respect to a given coordinate systems. In accordance with yet another embodiment, the combined effect of the differences in the shape and mass of the first and second portions of the hinge causes an effective translation of an axis of rotation in one or more directions with respect to a given coordinate systems.

As described and shown above, there is more body load in the BDL layer, of the two-axis MEMS Micromirror of FIG. 1, than in the TDL layer and thus the net CM (center of mass) is in the BDL layer below the axis of rotation of the outer hinges (107, 108). In accordance with one embodiment, the portion of the outer hinge in the TDL (the non-mirror layer) is made to be more compliant (less torsional stiffness) due to differences in area, size, shape, or mass as compared with the portion of the outer hinge in the BDL (the mirror layer). Consequently, the net result will be a shift in the axis of rotation of the outer hinge as dictated by the dominance of the torsional stiffness of the portion of the outer hinge in the BDL layer with respect to the torsional stiffness of the portion of the outer hinge in the TDL layer.

In accordance with one embodiment, the ratio of the dominance or compliance of the portion of the outer hinge in the non-mirror layer to the portion of the outer hinge in the mirror layer can be fine-tuned to completely eliminate the axis differential between CM, in one or more directions, and the outer hinge rotation axis without altering required stiffness of the hinge. As a result, the shock and vibration performance of a device utilizing such hinge design is improved. Similarly, reliability of such device would benefit and the device would become more resistant to in-situ shock and vibration in all directions.

Figure 4:
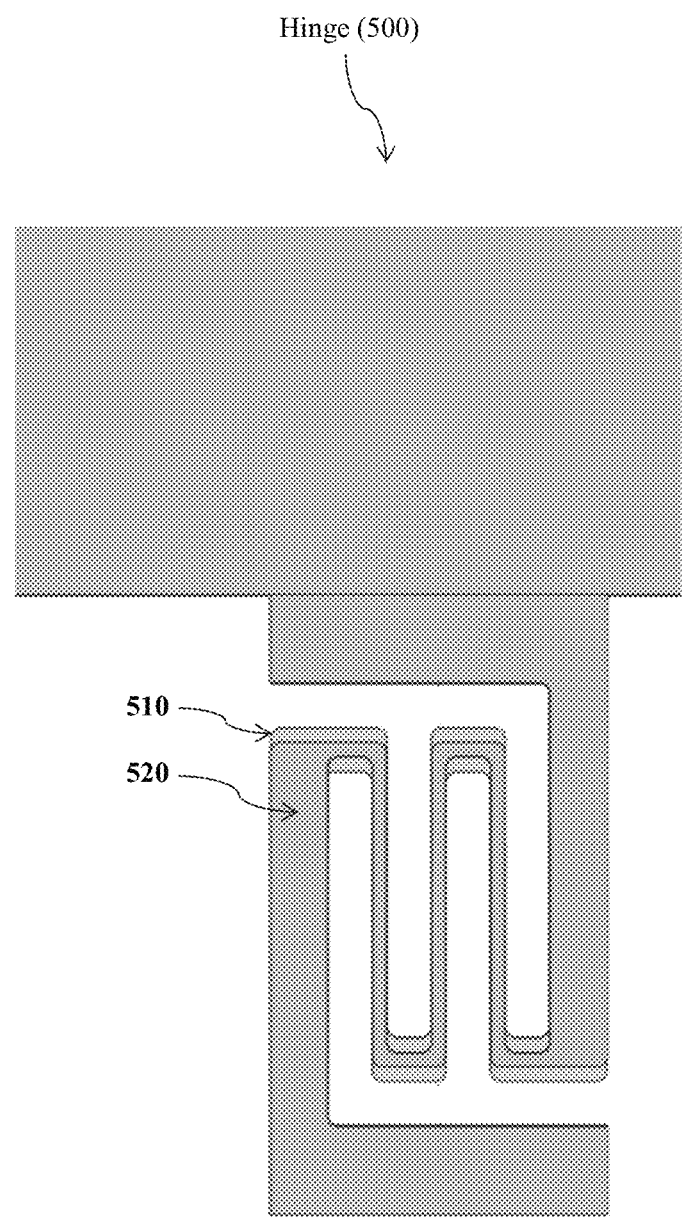
FIG. 4 showing an example of a hinge in accordance with one embodiment.

In accordance with one embodiment, a hinge (500), as shown in FIG. 4, comprises a first hinge (510) and a second hinge (520), the first hinge (510) is formed using a first layer, the second hinge (520) is formed using a second layer, the first hinge (510) is bonded to the second hinge (520) forming a layered hinge, the first hinge (510) having a first shape, a first size, a first area, and a first mass, the second hinge (520) having a second shape, a second size, a second area, and a second mass, wherein one or more of the first shape, the first size, the first area, and the first mass of the first hinge (510) are different than the corresponding second shape, second size, second area, and second mass of the second hinge (520), wherein the first and second layers are electrically conductive layers, and wherein the first layer is fastened or bonded to the second layer using a nonconductive material or layer.

In accordance with one embodiment, the layered hinge includes a third hinge formed using a third layer, wherein the third layer is an electrically nonconductive layer, and wherein the first and second layers are electrically conductive layers.

In accordance with one embodiment, a layered hinge includes two or more hinges; each hinge is formed using only one layer of two or more layers, wherein at least one of the two or more layers is an electrically nonconductive layer, and wherein at least one of the two or more layers is an electrically conductive layer.

In accordance with one embodiment, a layered hinge includes three or more hinges; each hinge is formed using only one layer of three or more layers, wherein at least one of the three or more layers is an electrically nonconductive layer, and wherein at least two of the three or more layers are electrically conductive layers.

In accordance with one embodiment, a two-axis MEMS micromirror comprising a micromirror; a first and second hinges attaches the micromirror to an inner frame; a third and fourth hinges attaches the inner frame to an outer frame, wherein the third and fourth hinges are orthogonal to the first and second hinges; a first and second comb drives configured to rotate the micromirror about a first axis formed by the first and second hinges; and a third and fourth comb drives configured to rotate the micromirror and the inner frame about a second axis formed by the third and fourth hinges such that the micromirror is rotated about the first and second axis in response to a force generated by any one or more of the first, second, third, and fourth comb drives. The first and second hinges includes a bottom conductive layer to conduct a first electrical voltage to (i) the micromirror, (ii) a first portion of the first comb drive, (iii) a first portion of the second comb drive, (iv) a first portion of the third comb drive, and (v) a first portion of the fourth comb drive, and wherein the third hinge includes (i) an upper hinge having an upper conductive layer to conduct a second electrical voltage to a second portion of the first comb drive, and (ii) a bottom hinge having a bottom conductive layer to conduct the first electrical voltage to any one or more of the first and second hinges, and wherein the upper hinge having a first torsional stiffness, the bottom hinge having a second torsional stiffness, and the first torsional stiffness is different from the second torsional stiffness.

In accordance with one embodiment, the fourth hinge includes (i) an upper hinge having an upper conductive layer to conduct a third electrical voltage to a second portion of the second comb drive, and (ii) a bottom hinge having a bottom conductive layer to conduct the first electrical voltage to any one or more of the first and second hinges, and wherein the upper hinge having a first torsional stiffness, the bottom hinge having a second torsional stiffness, and the first torsional stiffness is different from the second torsional stiffness.

In accordance with one embodiment, each of the third and fourth hinges is formed by bonding its upper hinge to its bottom hinge using at least one nonconductive layer.

In accordance with one embodiment, the two-axis MEMS micromirror further comprising a first bonding pad having an upper conductive layer to conduct the second electrical voltage to the upper conductive layer of the upper hinge of the third hinge; a second bonding pad having an upper conductive layer to conduct the third electrical voltage to the upper conductive layer of the upper hinge of the fourth hinge; a third bonding pad having an upper conductive layer to conduct a fourth electrical voltage to a second portion of the third comb drive; and a fourth bonding pad having an upper conductive layer to conduct a fifth electrical voltage to a second portion of the fourth comb drive.

In accordance with one embodiment, any one or more of the first, second, third, and fourth hinges comprises a serpentine hinge.

In accordance with one embodiment, wherein each of the third and fourth hinges comprises at least an upper hinge formed using an upper conductive layer, a bottom hinge formed using a bottom conductive layer, and an in-between hinge formed using a nonconductive layer, wherein the upper hinge, the in-between hinge, and the bottom hinge are formed using a single double SOI wafer.

In accordance with one embodiment, a layered hinge for use in MEMS micromirror is described. The layered hinge comprising a first hinge formed using a first layer, the first hinge having a first set of attributes, the first set of attributes includes one or more of a first shape, a first size, a first area, and a first mass; and a second hinge formed using a second layer, the second hinge having a second set of attributes, the second set of attributes includes a second shape, a second size, a second area, and a second mass, wherein at least one of the attributes of the first set of attributes of the first hinge is different from a corresponding attribute of the second set of attributes of the second hinge.

In accordance with one embodiment, each of the first and second layers is an electrically conductive layer.

In accordance with one embodiment, the first layer is electrically isolated from the second layer using a nonconductive layer, the nonconductive layer is a layer in-between the first and second layer.

In accordance with one embodiment, the first and second hinge are formed using a single SOI wafer.

In accordance with one embodiment, the first layer, the nonconductive layer, and the second layer constitute are formed using a single wafer.

In accordance with one embodiment, the single wafer is a double silicon-on-insulator (SOI) wafer.

In accordance with one embodiment, a hinge for use in a micro electro mechanical system, the hinge comprising a first hinge fabricated in accordance with a first set of dimensions using a top layer, the top layer is an electrically conductive layer, the first set of dimensions includes one or more of a first value corresponding to a length of the first hinge, a second value corresponding to a width of the first hinge, a third value corresponding to a height of the first hinge, a fourth value corresponding to a surface area of the first hinge, a fifth value corresponding to a volume of the first hinge, and a sixth value corresponding to a mass of the first hinge; a second hinge fabricated in accordance with a second set of dimensions using an in-between layer, the in-between layer is an electrically nonconductive layer, the second set of dimensions includes one or more of a first value corresponding to a length of the second hinge, a second value corresponding to a width of the second hinge, a third value corresponding to a height of the second hinge, a fourth value corresponding to a surface area of the second hinge, a fifth value corresponding to a volume of the second hinge, and a sixth value corresponding to a mass of the second hinge; and a third hinge fabricated in accordance with a third set of dimensions using a bottom layer, the bottom layer is an electrically conductive layer, the third set of dimensions includes one or more of a first value corresponding to a length of the third hinge, a second value corresponding to a width of the third hinge, a third value corresponding to a height of the third hinge, a fourth value corresponding to a surface area of the third hinge, a fifth value corresponding to a volume of the third hinge, and a sixth value corresponding to a mass of the third hinge, wherein at least one dimension of the first set of dimensions is different from at least one of (i) a corresponding dimension of the second set of dimensions of the third hinge, and (ii) a corresponding dimension of the third set of dimensions of the third hinge.

In accordance with one embodiment, all of the top layer, the in-between layer, and the bottom layer are layers of a single wafer. In other words, the starting material to fabricate the hinges is a single wafer having two layers of SOI with an oxide layer in-between.

In accordance with one embodiment, the single wafer is a double silicon-on-insulator (SOI) wafer.

In accordance with one embodiment, the top layer is a first SOI layer, the in-between layer is an oxide layer, and the bottom layer is a second SOI layer.

In accordance with one embodiment, the first hinge, the second hinge, and the third hinge form a first hinge element having a center of mass, the center of mass of the first hinge element is altered in accordance with a variance between corresponding dimensions of the first, second, and third set of dimensions of the first, second, and third hinges, respectively.

In accordance with one embodiment, an axis of rotation of the hinge for use in the micro electro mechanical system is proportionally altered in accordance with the center of mass of the first hinge element.

In accordance with one embodiment, the first hinge, the second hinge, and the third hinge form a contiguous first and second hinge elements, the first hinge element having a first center of mass, the second hinge element having a second center of mass, wherein the first center of mass of the first hinge element is altered in accordance with a first variance between corresponding dimensions of the first, second, and third set of dimensions of the first, second, and third hinges, respectively, and wherein the second center of mass of the second hinge element is altered in accordance with a second variance between corresponding dimensions of the first, second, and third set of dimensions of the first, second, and third hinges, respectively.

In accordance with one embodiment, an axis of rotation of the hinge for use in the micro electro mechanical system is proportionally altered in accordance with (i) the first center of mass of the first hinge element, and (ii) the second center of mass of the second hinge element.

Although each of the illustrative embodiments and its advantages have been described in detail, it should be understood that various changes, substitutions, and alterations can be made herein without departing from the spirit and scope of the invention as defined by the appended claims. For example, various changes to any one of the many features of a layered hinge can be implemented individually or in combination with other changes to arrive at a desired change in the CM of the layered hinge that would eliminate or offset the effect of an unbalanced center of a mass in one or more directions with respect to an axis of rotation. As another example, it will be readily understood by those skilled in the art that geometries may be varied while remaining within the scope of the present invention.

For example, a the BDL layer of the DSOI wafer can be directly bonded to the bottom DSP wafer without any intermediary oxide layer or any other type of layer. Consequently, the substrate is electrically coupled to the BDL and is thus at the same potential (grounded) as other portions (i.e. portion of hinges or combs drives electrically coupled to the BDL) of the BDL layer. In an alternative embodiment, the mirror is processed, or fabricated, in the TDL layer (instead of the BDL layer), and thus four BDL segments over the cavity region carry the drive voltages to the four comb drives using the electrically conductive segments of the BDL. In yet another example, most of the TDL can be at one electrical potential (e.g. grounded), while certain isolated regions in TDL carry certain drive voltages and pass it to certain BDL segments using thru silicon vias (TSV) that provide electrical pathway that electrically connects the two layers. For example, the TSVs are typically made out of metal or poly-silicon plugs. Moreover, the TSVs can also be used to connect the ground bondpad layer, e.g. the TDL, to the BDL and/or substrate. These various techniques may be used depending on various processes or starting material used to fabricate the hinges or the two-axis MEMS micromirror. In addition, some technique may be a preferred approach with certain foundry or certain manufacturing processes.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention that various types of silicon, SOI or other types of conductive or semi-conductive material, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim:

1. A layered hinge for use in a MEMS micromirror, the layered hinge comprising:
   a first hinge portion formed in a first layer, the first hinge portion having a first set of attributes and a first torsional stiffness based on one or more attributes of the first set of attributes, wherein the first set of attributes includes one or more of a first shape, a first size, a first area, and a first mass; and
   a second hinge portion formed in a second layer, wherein the second layer is over the first layer and separated from the first layer by a third layer, the second hinge portion having a second set of attributes and a second torsional stiffness based on one or more attributes of the second set of attributes, wherein the second set of attributes includes a second shape, a second size, a second area, and a second mass, wherein at least one of the first set of attributes is different from a corresponding attribute of the second set of attributes such that the first torsional stiffness is different from the second torsional stiffness and the layered hinge provides an axis of rotation located in the first layer;
   wherein the first hinge portion has a first serpentine shape and the second hinge portion has a second serpentine shape that is different from the first serpentine shape.

2. The layered hinge of claim 1, wherein the first and second layers are from a double silicon-on-insulator (DSOI) wafer, and wherein the layered hinge further includes a bond pad in the first layer or the second layer, the bond pad being bonded to a platform from a secondary wafer different from the DSOI wafer.

3. The layered hinge of claim 1, wherein each of the first and second layers is an electrically conductive layer, the third layer is a nonconductive layer that electrically isolates the first and second layers from each other.

4. The layered hinge of claim 3, wherein the axis of rotation of the layered hinge is located about half way into the first layer.

5. The layered hinge of claim 1, wherein:
   the first hinge portion includes first and second thick braces, a first plurality of parallel thin elements disposed between the first and second thick braces, and first connecting elements coupling the first plurality of parallel thin elements to each other and to the first and second thick braces;
   the second hinge portion includes third and fourth thick braces, a second plurality of parallel thin elements disposed between the third and fourth thick braces, and second connecting elements coupling the second plurality of parallel thin elements to each other and to the third and fourth thick braces; and
   the first connecting elements are wider than the second connecting elements.

6. A micro electro mechanical system, comprising:
   a frame;
   a hinge; and a micro electro component attached to the frame via the first hinge and rotatable with respect to the frame in response to at least one of first and second voltages;

wherein the micro electro mechanical system is formed in a multi-layer structure including a first conductive layer, a second conductive layer, and a non-conductive layer between the first conductive layer and the second conductive layer, wherein the hinge includes a first hinge portion in the first conductive layer, a second hinge portion in the non-conductive layer, and a third hinge portion in the second conductive layer, each hinge portion of the first, second and third hinge portions having a respective set of attributes including one or more of a shape of the each hinge portion, a length of the each hinge portion, a width of the each hinge portion, a height of the each hinge portion, a surface area of the each hinge portion, and a volume of the each hinge portion, wherein the first hinge portion conducts the first voltage and the third hinge portion conducts the second voltage;

wherein the micro electro component has a center of mass in the first conductive layer, and wherein at least one attribute of the first hinge portion is different from at least one corresponding attribute of the third hinge portion such that an axis of rotation for the micro electro component is in the first conductive layer;

wherein the first hinge portion has a first serpentine shape and the third hinge portion has a second serpentine shape that is different from the first serpentine shape.

7. The micro electro mechanical system of claim 6, wherein the first, second and third layers are layers from a first wafer, and wherein at least part of the frame is from a second wafer different from the first wafer.

8. The micro electro mechanical system of claim 7, wherein the first wafer is a double silicon-on-insulator (DSOI) wafer.

9. The micro electro mechanical system of claim 8, wherein the second wafer is a double sided polished (DSP) silicon wafer.

10. The micro electro mechanical system of claim 6, wherein the first hinge portion has a first torsional stiffness and the third hinge portion has a second torsional stiffness that is less than the first torsional stiffness.

11. The micro electro mechanical system of claim 10, further comprising at least one comb drive including first comb fingers and second comb fingers, wherein the first hinge portion conducts the first voltage to the first comb fingers and the third hinge portion conducts the second voltage to the second comb fingers.

12. The micro electro mechanical system of claim 6, wherein the axis of rotation is about half way into the first conductive layer.

13. The micro electro mechanical system of claim 6, wherein the micro electro component includes a micro mirror formed in the first conductive layer.

14. The micro electro mechanical system of claim 6, wherein:

the first hinge portion includes first and second thick braces, a first plurality of parallel thin elements disposed between the first and second thick braces, and first connecting elements coupling the first plurality of parallel thin elements to each other and to the first and second thick braces;

the third hinge portion includes third and fourth thick braces, a second plurality of parallel thin elements disposed between the third and fourth thick braces, and second connecting elements coupling the second plurality of parallel thin elements to each other and to the third and fourth thick braces; and the first connecting elements are wider than the second connecting elements.

15. The micro electro mechanical system of claim 6, wherein the axis of rotation of the hinge is located about half way into the first conductive layer.

* * * * *